United States Patent [19]

Porter et al.

[11] Patent Number: 5,473,508
[45] Date of Patent: Dec. 5, 1995

[54] FOCUSED CPU AIR COOLING SYSTEM INCLUDING HIGH EFFICIENCY HEAT EXCHANGER

[75] Inventors: Warren W. Porter, Escondido, Calif.; Charles B. Wall, III, Irmo, S.C.

[73] Assignee: AT&T Global Information Solutions Company, Dayton, Ohio

[21] Appl. No.: 251,411

[22] Filed: May 31, 1994

[51] Int. Cl.⁶ .................................................. H05K 7/20
[52] U.S. Cl. .......................... 361/695; 165/80.3; 174/16.1; 257/713; 257/722; 361/704
[58] Field of Search ................ 62/259.2; 165/80.2–80.4, 165/104.33, 185; 174/15.1, 16.1, 16.3; 257/713–714, 721–722; 361/688–704, 709–719, 722

[56] References Cited

U.S. PATENT DOCUMENTS

| | | | |
|---|---|---|---|
| 3,564,109 | 2/1971 | Ruechardt | 174/15 |
| 3,609,991 | 10/1971 | Chu et al. | 62/333 |
| 3,648,113 | 3/1972 | Rathjen et al. | 317/100 |
| 3,725,566 | 4/1973 | Plizak | 174/15 R |
| 3,737,728 | 6/1973 | Austin | 317/100 |
| 3,917,370 | 11/1975 | Thornton et al. | 339/16 R |
| 4,155,402 | 5/1979 | Just | 165/46 |
| 4,408,255 | 11/1983 | Adkins | 361/382 |
| 4,504,030 | 3/1985 | Kniat et al. | 244/57 |
| 4,612,978 | 9/1986 | Cutchaw | 165/104.33 |
| 4,644,385 | 2/1987 | Nakanishi et al. | 361/689 |
| 4,652,970 | 3/1987 | Watari et al. | 361/385 |
| 4,686,606 | 8/1987 | Yamada et al. | 361/385 |
| 4,882,654 | 11/1989 | Nelson et al. | 361/382 |
| 4,953,634 | 9/1990 | Nelson et al. | 361/384 |
| 5,021,924 | 6/1991 | Kieda et al. | 361/385 |
| 5,057,968 | 10/1991 | Morrison | 361/385 |
| 5,067,047 | 11/1991 | Azar | 361/384 |
| 5,136,856 | 8/1992 | Yamamoto et al. | 62/176.6 |
| 5,144,531 | 9/1992 | Go et al. | 361/382 |
| 5,146,314 | 9/1992 | Pankove | 357/82 |
| 5,177,666 | 1/1993 | Bland et al. | 361/382 |
| 5,218,513 | 6/1993 | Brown | 361/384 |
| 5,239,200 | 8/1993 | Messina et al. | 257/714 |

FOREIGN PATENT DOCUMENTS

| | | | |
|---|---|---|---|
| 4107900 | 4/1992 | Japan | 361/689 |
| 0591684 | 1/1978 | U.S.S.R. | 165/185 |

*Primary Examiner*—Gregory D. Thompson
*Attorney, Agent, or Firm*—James M. Stover

[57] ABSTRACT

A cooling system for a computer system which includes at least one component which generates substantial thermal energy. The cooling system includes a high efficiency heat exchanger formed of a thermally conductive material which is attached to the heat generating component. This heat exchanger comprises a hollow body formed of a thermally conductive material for attachment to the heat generating component, a coolant inlet provided through the wall of the hollow body for providing cooling air from received from an air compressor to the interior of the heat exchanger, and a coolant outlet provided through the wall of the hollow body for providing egress of cooling air from the heat exchanger. Within the hollow body, the exchanger includes a a corrugated metal fin which is periodically lanced to provide for the passage of cooling air through the fin. The metal fin occupies substantially all of the cavity within the heat exchanger's hollow body and is oriented such that the corrugations in the fin are positioned between the heat exchanger's inlet and outlet, providing maximum contact between the cooling air and the surface area of the metal fin.

9 Claims, 7 Drawing Sheets

FOCUSED CPU AIR COOLING SYSTEM INCLUDING HIGH EFFICIENCY HEAT EXCHANGER

The present invention relates to a cooling system for a computer system and, more particularly, to an air cooling system for a multi-processor computer system employing a high efficiency heat exchanger attached to each processor.

BACKGROUND OF THE INVENTION

The increase in circuit density and operating frequency of integrated circuits and multi-chip modules utilized in present day computer systems has resulted in an exponential increase in the power dissipated by those components. For example, just a few years ago the maximum power generated by a typical complementary metal oxide semiconductor (CMOS) central processor unit (CPU) utilized within a personal computer was in the neighborhood of two watts. Currently, the Intel Corporation Pentium™ processor dissipates an estimated sixteen watts, and the next generation Intel Corporation processor is estimated to generate near thirty watts. Cooling arrangements must be provided to prevent damage to these integrated circuits from the high temperatures generated by the devices.

In addition to cooling to prevent damage resulting from overheating, it is known that a CMOS circuit will operate at higher clock speeds as the circuit temperature is lowered. In some cases the processor frequency of CMOS processor has been improved to near 300% through the cooling of the processor die to a temperature of approximately −200° C. Although many methods for cooling processors and other computer components are known, most traditional air cooling techniques, such as natural or forced air convection into the atmosphere, are no longer adequate to provide the heat removal required for these high power integrated circuits.

OBJECTS OF THE INVENTION

It is therefore an object of the present invention to provide a new and useful cooling system for a computer system which is not subject to the above disadvantages.

It is another object of the present invention to provide a new, useful and highly efficient focused air cooling system for a multi-processor computer system.

It is still a further object of the present invention to provide such a focused air cooling system employing a high efficiency heat exchanger attached to each processor within a multi-processor computer system.

It is an additional object of the present invention to provide a new and useful cooling system which provides a consistent cooling air flow to the processors within the a multiple processor computer system, thereby establishing a stable processor chip temperature.

It is a further object of the present invention to provide a new and useful cooling system which provides consistent cooling of high power computer components regardless of the adjacent environment.

It is also an object of the present invention to provide a new and useful heat exchanger for use within an air cooling system, the heat exchanger providing focused cooling of an attached integrated circuit.

It is another object of the present invention to provide such a heat exchanger which features a very low profile, much less than the size of a common heat sink, and does not extend beyond the perimeter of the attached processor chip, as many common heat sinks often do.

SUMMARY OF THE INVENTION

There is provided, in accordance with the present invention, a focused air cooling system for a multiple processor computer system, including a vacuum pump for providing a cooling airflow; a specially designed heat exchanger thermally attached to each processor in the computer system, and a conduit connecting the vacuum pump unit with each heat exchanger.

Each heat exchanger comprises a hollow body formed of a thermally conductive material for attachment to its corresponding processor; an internal cooling structure formed of a thermally conductive material for providing an increased surface area which is exposed to the cooling airflow provided to the heat exchanger, the cooling structure being thermally attached within the heat exchanger's hollow body; and a cooling air inlet and outlet provided through the wall of the hollow heat exchanger body for providing ingress and egress of cooling air. The outlet is connected to the conduit described above to complete the cooling airflow pathway between the heat exchanger and the vacuum pump.

In the described embodiment, the heat exchanger internal cooling structure comprises a corrugated metal fin which is periodically lanced to provide for the passage of cooling air through the fin. The metal fin occupies substantially all of the cavity within the heat exchanger's hollow body and is oriented such that the corrugations in the fin are positioned between the heat exchanger's inlet and outlet.

The above and other objects, features, and advantages of the present invention will become apparent from the following description and the attached drawings.

DETAILED DESCRIPTION OF THE PREFERRED EMBODIMENT

Figure 1:
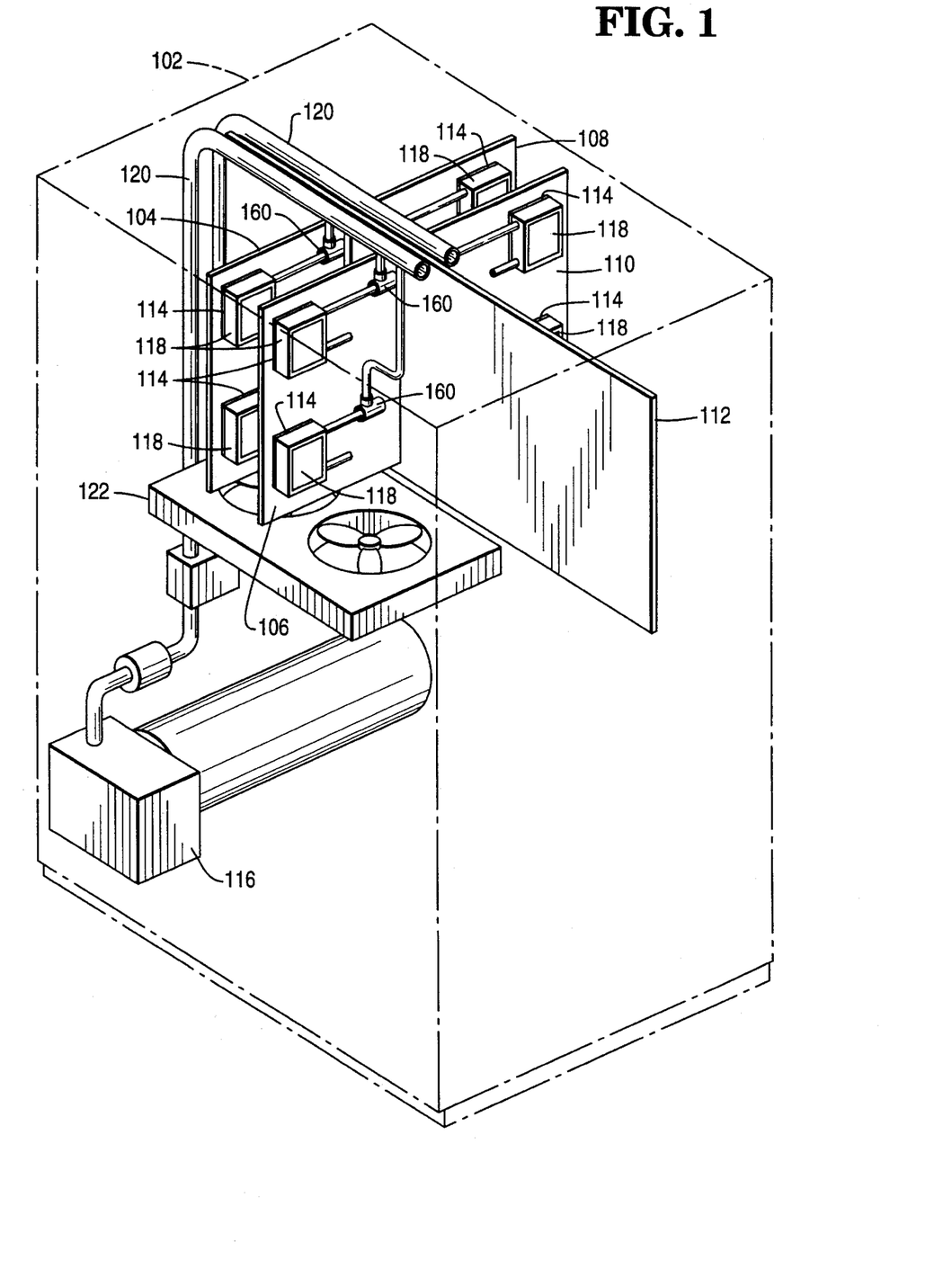
FIG. 1 is a perspective view of a processor cabinet including a plurality of printed circuit boards and the focused air cooling system according to the present invention.

Referring now to FIG. 1, there is seen a typical processor cabinet 102, shown in outline, which houses the components of a multiple processor computer system and includes a cooling system in accordance with the present invention. However, only those components necessary for an understanding of the present invention are shown and discussed herein. The processor cabinetry may additionally house disk drives, power supplies, memory boards and other structures not shown in FIG. 1.

The computer system includes a plurality of processor boards, four of which are shown. These boards, identified by reference numerals 104, 106, 108 and 110, each include electrical contacts along one edge which are press fitted into mating connectors secured to the surface of a system backpanel 112, in a manner which is well known by those skilled in electronics technology. The backpanel provides common connections for the transmission of power, control and data signals between the various components of the computer system. The processor boards, which will be described in greater detail below with reference to FIG. 2, each include two processors or CPUs 114. Also shown in FIG. 1 is a typical fan panel 122 that generates an air flow directed upward across the processor boards and other components within the cabinet.

The primary components of the cooling system shown in FIG. 1 include a vacuum pump unit 116, a heat exchanger assembly 118 affixed to each processor 114, and an air distribution conduit 120 connecting each heat exchanger assembly with vacuum pump unit 116. To facilitate the installation, removal and replacement of processor boards, such as board 104, air coupling devices 160 are installed into each section of conduit 120 provided to the processor boards. This structure permits connection or disconnection of the board mounted components with the cooling system concurrently with the electrical connection of the board mounted components with the system backpanel 112. Also provided in the preferred embodiment of the invention, shown in FIG. 1, the vacuum pump unit 116 includes a reservoir, filter and pressure regulator to store, clean and control the air flow drawn through each processor, and is located in the bottom of cabinet 102 to facilitate disconnection of the vacuum pump unit from the conduit system for removal and service or replacement. Redundant vacuum pumps may be provided to increase the reliability of the cooling system.

Figure 2:
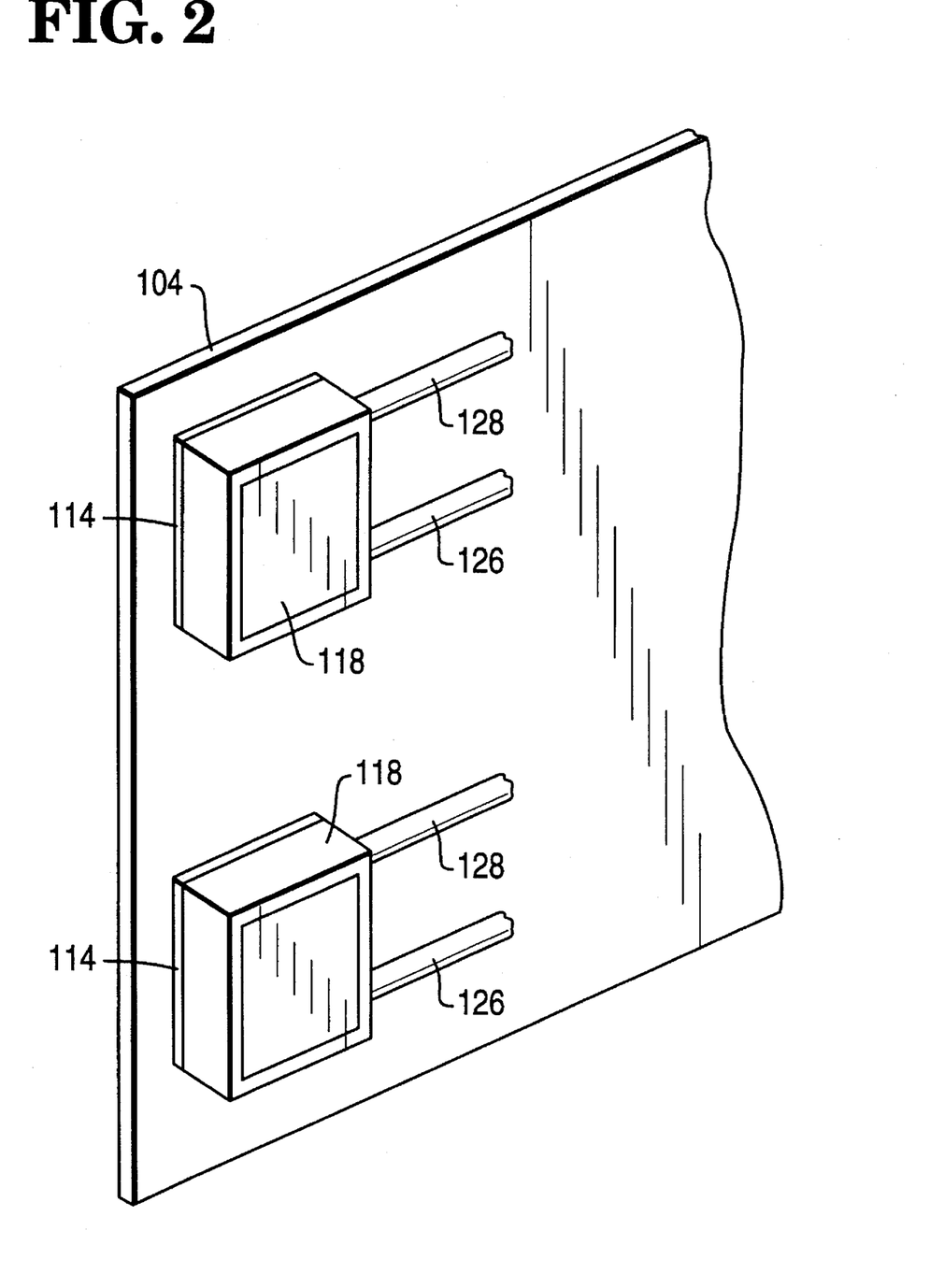
FIG. 2 is a printed circuit board subassembly, shown in perspective view, including two CPUs and corresponding CPU heat exchanger components of the cooling system of the present invention.

Processor board 104 is shown in perspective view in FIG. 2. The processor board is a printed circuit board to which is attached two CPUs 114 as well as other circuit elements which are not shown. It should be noted that although the processor boards are shown including two CPUs, one, two or more processors can be accommodated on each processor board and the cooling system, described herein, designed accordingly. Attached to each CPU is a heat exchanger assembly 118. The heat exchanger assembly includes an air outlet 128 which is connected via air distribution conduit 120 to vaccum pump unit 116.

Figure 3:
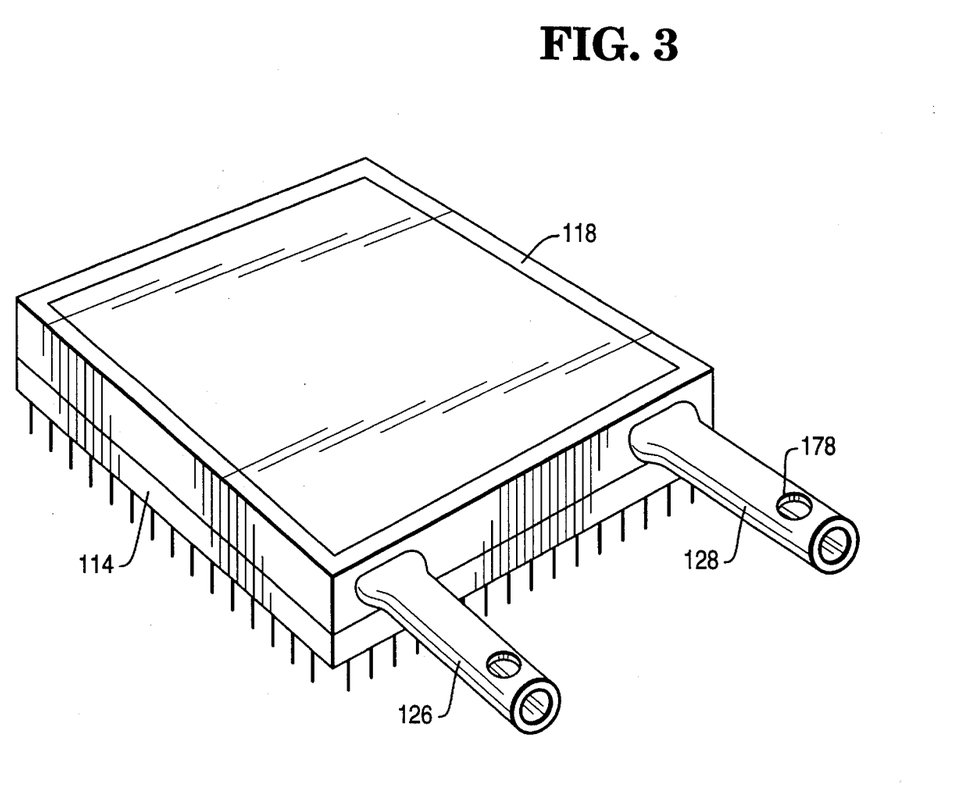
FIG. 3 is a perspective view of a single CPU together with its corresponding CPU heat exchanger.

The construction of heat exchanger assembly 118 will now be described with reference to FIGS. 3 through 6. FIG. 3 is a perspective view of a single CPU together with its corresponding CPU heat exchanger. The heat exchanger assembly 118 is formed of a thermally conductive material and is thermally mated to the top surface of CPU 114 using, for example, a thermal epoxy that provides a thermal and mechanical bond. Alternatively, a thermal grease may be utilized together with a spring loaded retainer or some other means of mechanical attachment to thermally mate heat exchanger assembly 118 with CPU 114. The heat exchanger assembly includes an air inlet 126 and air oulet 128 which provide for the entry and exit, respectively, of cooling air. In the embodiment described herein, air inlet 126 and air outlet 128 can be used interchangeably, i.e., either pathway can function as an inlet or an outlet.

Figure 4:
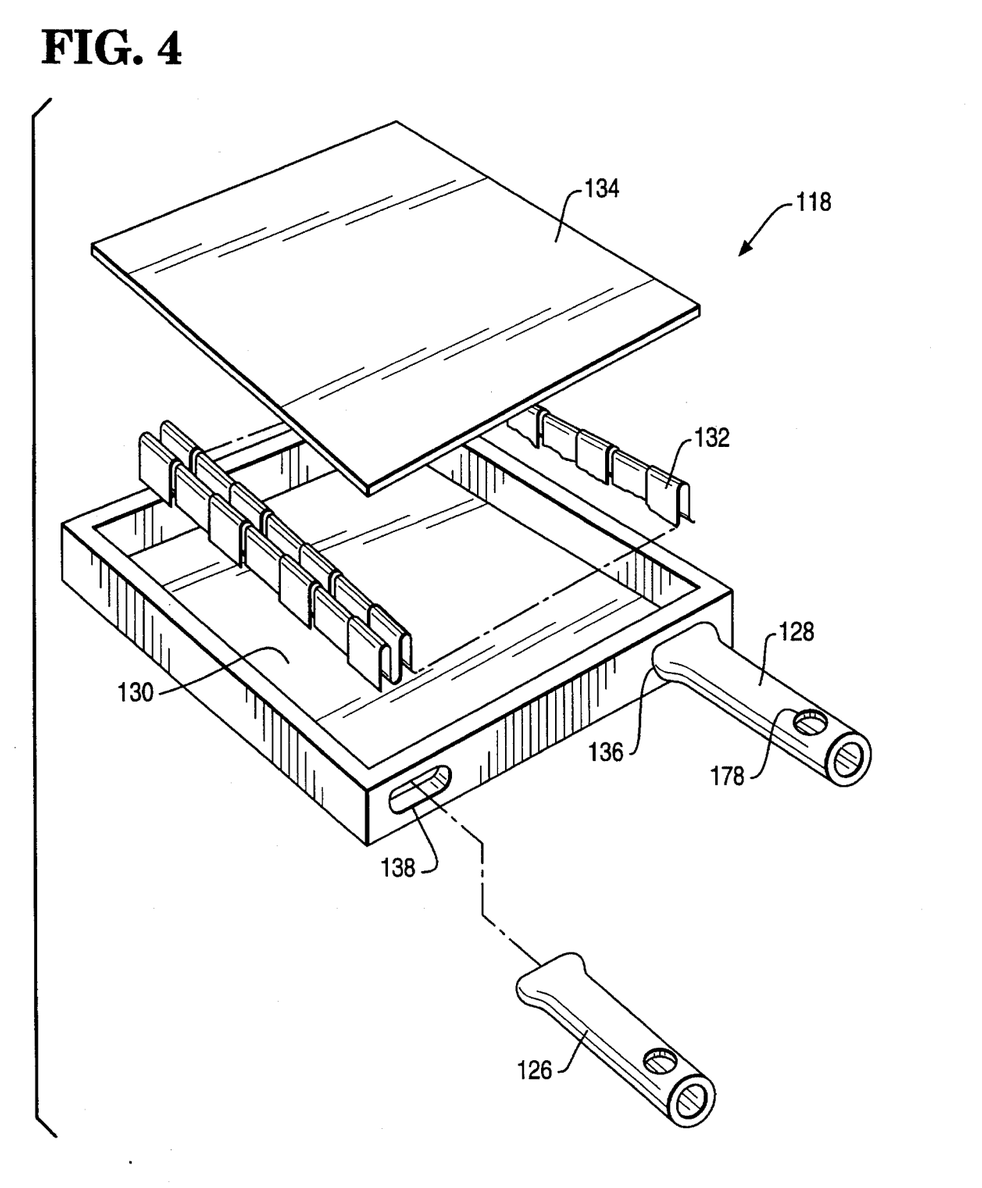
FIG. 4 is a disassembled perspective view of the CPU heat exchanger shown in FIG. 3.

The CPU heat exchanger assembly 118 is shown disassembled in FIG. 4. In the embodiment shown, the heat exchanger assembly includes a hollow body 130, a specially formed, corrugated metal fin 132; a metal lid 134; and two metal tubes forming the air inlet 126 and air outlet 128. Two openings 136 and 138 are provided through the wall of the heat exchanger body into the hollow chamber within the body. Air inlet 126 and outlet 128 are installed into openings 136 and 138, respectively. Metal fin 132 is installed inside hollow body 130 with the corrugations oriented in the same directions as the air I/O tubes 126 and 128, and covered by metal lid 134. All of the heat exchanger parts are made of metal and are soldered or brazed together into an inseparable assembly. Heat exchanger body 130, metal fin 132 and lid 134 must be have a complete solder or braze interface to maximize heat transfer characteristics of the exchanger assembly. Additionally, the solder or braze joints between exchanger body 130, lid 134, air inlet 126 and air outlet 128 must be impenetrable to the flow of gas and liquid.

Figure 5:
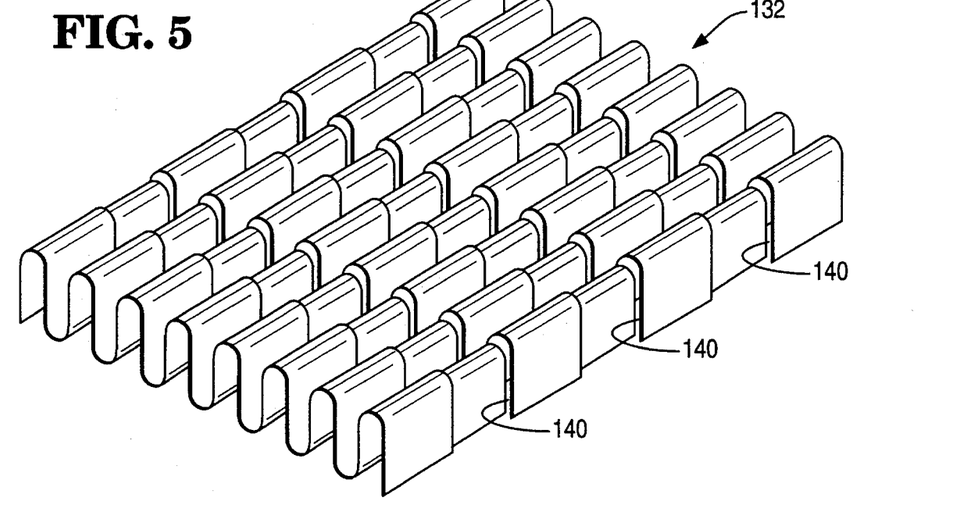
FIG. 5 is a perspective view of the fin assembly component of the CPU heat exchanger shown in FIGS. 3 and 4.
Figure 6:
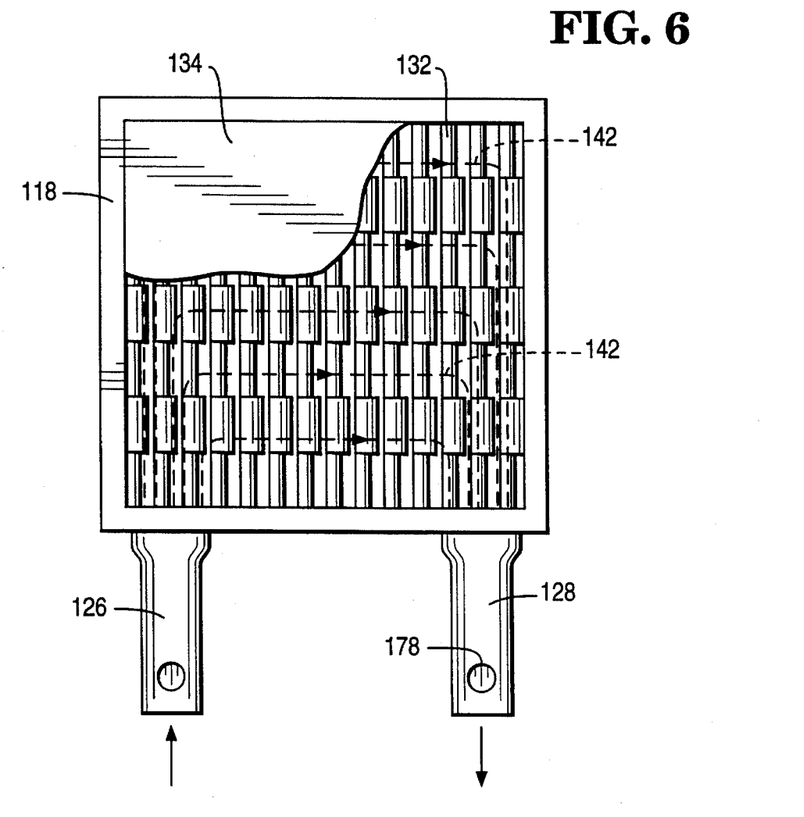
FIG. 6 is a top view, partially cut away, of the CPU heat exchanger of FIGS. 3 and 4, illustrating the flow of cooling air through the exchanger.

Corrugated metal fin 132, shown in perspective view in FIGS. 5, is a commercially available thin metal fin. Although many configurations of the metal fin are available, the heat exchanger described herein employs a metal fin fabricated from 0.004 inch thick brass having approximately twenty-five corrugations per inch and a height of 0.120 inch. Metal fin 132 is lanced repeatedly resulting in periodic perforations 140 in the fin walls.

The operation of the closed cooling system described herein is as follows. Vacuum pump unit 116 provides a vacuum to the system of conduits 120 and thereby to each of the heat exchanger assemblies 118 to generate a flow of cooling air though the heat exchangers. At each heat exchanger, cooling air is drawn from the computer cabinet into the heat exchanger assembly through air inlet 126 and into an adjacent corrugation channel. The cooling air is then drawn laterally across the heat exchanger through the lanced perforations 140 in metal fin 132 and exits the heat exchanger assembly through outlet 128 into conduit 120, as is shown in the cut away view of the CPU heat exchanger illustrated in FIG. 6. Arrows 142 illustrate the direction of cooling air flow through the heat exchanger assembly.

To facilitate the installation, removal and replacement of processor boards, such as board 104, cooling air I/O tubes 126 and 128 are designed to cooperate with corresponding air coupling devices 160 attached to conduits 120. This structure permits connection or disconnection of the board mounted components with the cooling system concurrently with the electrical connection of the board mounted components with the system backpanel 112.

Figure 7:
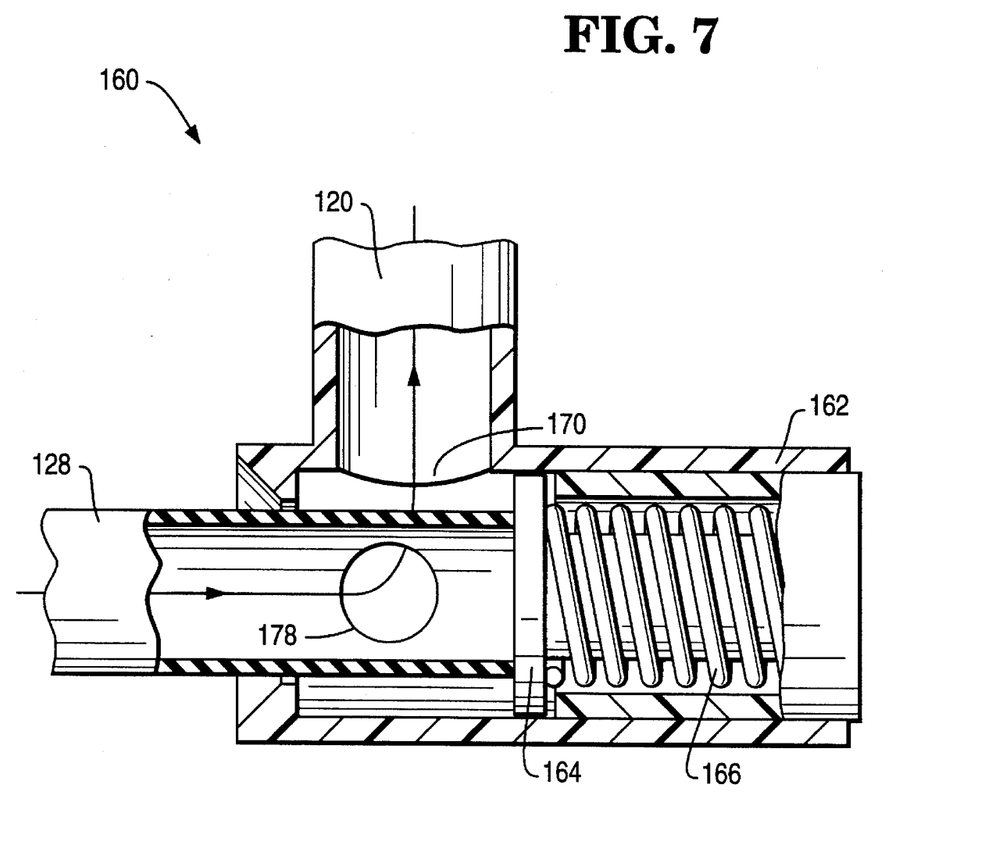
FIGS. 7 and 8 are sectional views of a quick-release air coupling device utilized to connect cooling conduits within the system of the present invention.
Figure 8:
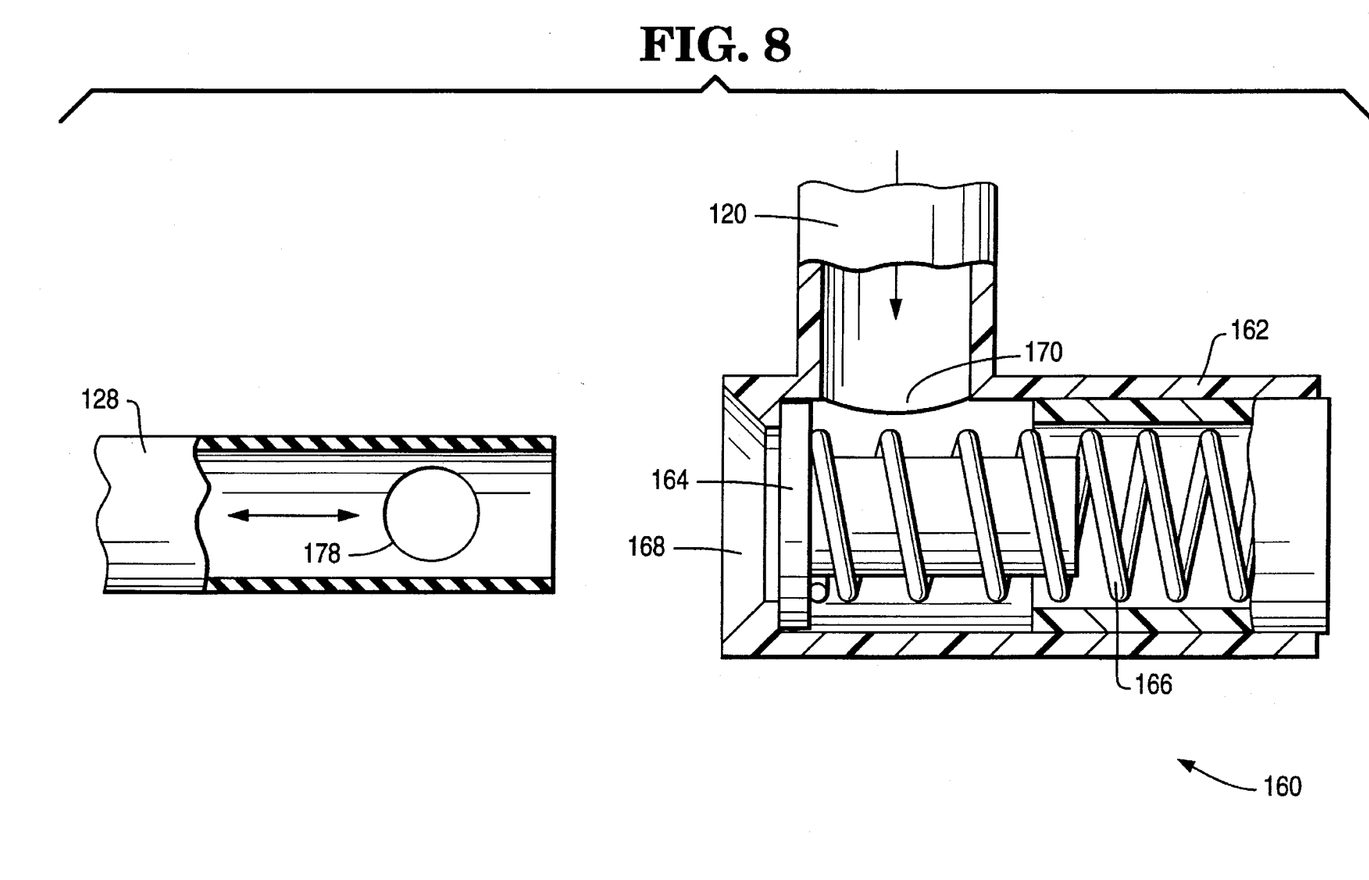

An air coupling device 160 is shown in the sectional views of FIGS. 7 and 8. The air coupling device comprises a molded plastic housing 162, piston 164 and metal spring 166. The housing is a cylinder having an opening 168 at one end for receiving air outlet tube 128. A second opening 170 is provided in the wall of the cylindrical housing 162 near the open end of the housing. This second opening is mated to conduit 120. Piston 164 is installed within cylindrical housing 162 with spring 166 located between the piston and the closed end of housing 162. Spring 166 urges piston 164 into a first position wherein opening 168 is sealed closed by the end of the piston. Piston 164 is moveable into a second position, with spring 166 depressed, such that an air passageway between openings 168 and 170 is created. Piston 164 is placed into this second position through the insertion of air outlet tube 128 into opening 168. A hole 178 is provided in the wall of outlet tube 128 near the end of the tube so that once air outlet tube 128 is fully inserted into opening 168, cooling air can be drawn into conduit 120, through opening 170 and hole 178 from the air outlet tube.

Air coupling devices 160 provide for the connection or removal of heat exchangers into the cooling system without interference with the operation of the cooling system whenever a processor board, such as processor board 104, is installed into or removed from backpanel 112. Should a processor board containing heat exchangers be removed, the associated air coupling devices seal the cooling system to prevent a degradation in cooling system performance. Remaining installed processor boards continue to receive cooling air.

It can thus be seen that there has been provided by the present invention a focused air cooling system for a multi-processor computer system which employs a high efficiency heat exchanger attached to each processor within the multi-processor computer system. The cooling system as described provides a consistent cooling air flow to the processors within the computer system thereby establishing a stable processor chip temperature. Additionally, the system of heat exchangers reduces the need for fans to cool other components in the computer system. The heat exchanger utilized within the described cooling system features a very low profile, as much as a third of the size of a common heat sink, and does not extend beyond the perimeter of the attached processor chip, as many common heat sinks often do. The described system improves cooling by better than four times that of current pin fin heat sinks.

Although the presently preferred embodiment of the invention has been described, it will be understood that various changes may be made within the scope of the appended claims. For example, components other than the computer system CPUs may also be cooled by the present invention. Additionally, a cooling air flow can be generated through the utilization of a compressor unit rather than a vacuum pump. The high pressure air provided by the air compressor would be directed to each heat exhanger through conduit network 120. Use of a compressor rather than a vacuum pump may reduce cooling efficiency slightly, however, as the compression process heats the cooling air.

What is claimed is:

1. In a computer system including at least one component which generates substantial thermal energy, a cooling system comprising:

a vacuum pump unit for generating a cooling airflow;

a heat exchanger comprising a thermally conductive material, said heat exchanger being in thermal contact with said component, said heat exchanger comprising:

a hollow body formed of a thermally conductive material for attachment to said component;

an internal cooling structure formed of a thermally conductive material for providing an increased surface area which is exposed to said cooling air, said cooling structure being thermally attached within said hollow body, said cooling structure comprising a corrugated metal fin which occupies substantially all of the cavity within said hollow body, said corrugated metal fin being periodically lanced to provide for the passage of cooling air through said corrugated metal fin;

a coolant inlet provided through the wall of said hollow body; and a coolant outlet provided through the wall of said hollow body; and a conduit having a first end which is connected with said vacuum pump unit and a second end which is connected to said coolant outlet for providing a cooling air pathway from said heat exchanger to said vacuum pump unit.

2. A focused cooling system for a multiple processor computer system, comprising:

a vacuum pump unit for generating a flow of pressurized coolant;

a heat exchanger corresponding to each processor in said computer system, each one of said heat exchangers being formed of a thermally conductive material and attached to its corresponding processor, each one of said heat exchangers comprising:

a hollow body formed of a thermally conductive material for attachment to said component;

an internal cooling structure formed of a thermally conductive material for providing an increased surface area which is exposed to said pressurized coolant, said cooling structure being thermally attached within said hollow body, said cooling structure comprising a corrugated metal fin which occupies substantially all of the cavity within said hollow body, said corrugated metal fin being periodically lanced to provide for the passage of coolant through said corrugated metal fin;

a coolant inlet provided through the wall of said hollow body; and a coolant outlet provided through the wall of said hollow body; and a conduit connecting said vacuum pump unit with each outlet in each one of said heat exchangers, said conduit providing a coolant pathway from said heat exchanger to said vacuum pump unit.

3. The heat exchanger in accordance with claim 2, wherein:

said coolant comprises air.

4. A heat exchanger for attachment to an electronic component which generates substantial thermal energy, the heat exchanger comprising:

a hollow body formed of a thermally conductive material adapted to be attached to said electronic component;

an internal cooling structure formed of a thermally conductive material for providing an increased surface area for exposure to a coolant provided to said heat exchanger, said cooling structure being thermally attached within said hollow body, said cooling structure comprising a corrugated metal fin which occupies substantially all of the cavity within said hollow body, said corrugated metal fin being periodically lanced to provide for the passage of coolant through said corrugated metal fin;

a coolant inlet provided through the wall said hollow body; and a coolant outlet provided through the wall said hollow body;

said inlet and said outlet being located to establish a coolant path through said hollow body which maximizes contact between said coolant and the surface area of said cooling structure.

5. The heat exchanger in accordance with claim 4, wherein:

said inlet and said outlet and said corrugated metal fin are located such that the corrugations in said metal fin are placed between said inlet and said outlet.

6. An electronics assembly, comprising:

at least one component which generates substantial thermal energy;

a vacuum pump unit for generating a cooling airlow;

a heat exchanger comprising a thermally conductive material, said heat exchanger being in thermal contact with said component, said heat exchanger comprising:

a hollow body formed of a thermally conductive material for attachment to said component;

an internal cooling structure formed of a thermally conductive material for providing an increased surface area which is exposed to said cooling air, said cooling structure being thermally attached within said hollow body, said cooling structure comprising a corrugated metal fin which occupies substantially all of the cavity within said hollow body, said corrugated metal fin being periodically lanced to provide for the passage of cooling air through said corrugated metal fin;

a coolant inlet provided through the wall of said hollow body; and a coolant outlet provided through the wall of said hollow body; and a conduit having a first end which is connected with said vacuum pump unit and a second end which is connected to said coolant outlet for providing a cooling air pathway from said heat exchanger to said vacuum pump unit.

7. The electronics assembly in accordance with claim 6, further comprising:

a circuit board on which said component is mounted;

a backpanel to which said circuit board is detachably connected; and means for detachably coupling said heat exchanger outlet with said conduit, whereby said circuit board can be readily detached from said backpanel, with said heat exchanger inlet simultaneously being readily detached from said conduit.

8. A focused cooling system for a multiple processor computer system, comprising:

a coolant compressor unit for supplying a pressurized coolant;

a heat exchanger corresponding to each processor in said computer system, each one of said heat exchangers being formed of a thermally conductive material and attached to its corresponding processor, each one of said heat exchangers comprising:

a hollow body formed of a thermally conductive material for attachment to its corresponding processor;

an internal cooling structure formed of a thermally conductive material for providing an increased surface area which is exposed to said pressurized coolant, said cooling structure being thermally attached within said hollow body, said cooling structure comprising a corrugated metal fin which occupies substantially all of the cavity within said hollow body, said corrugated metal fin being periodically lanced to provide for the passage of coolant through said corrugated metal fin;

a coolant inlet provided through the wall of said hollow body; and a coolant outlet provided through the wall of said hollow body; and a conduit connecting said coolant compressor unit with each inlet in each one of said heat exchangers, said conduit providing said pressurized coolant to each one of said heat exchangers.

9. The heat exchanger in accordance with claim 8, wherein:

said pressurized coolant comprises compressed air.

* * * * *